(12) United States Patent
Huang et al.

(10) Patent No.: US 12,089,415 B2
(45) Date of Patent: Sep. 10, 2024

(54) METAL LAYERS FOR INCREASING POLARIZATION OF FERROELECTRIC MEMORY DEVICE

(71) Applicant: Taiwan Semiconductor Manufacturing Company, Ltd., Hsinchu (TW)

(72) Inventors: Yen-Chieh Huang, Changhua County (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 157 days.

(21) Appl. No.: 17/569,988

(22) Filed: Jan. 6, 2022

(65) Prior Publication Data
US 2023/0145317 A1 May 11, 2023

Related U.S. Application Data

(60) Provisional application No. 63/278,230, filed on Nov. 11, 2021.

(51) Int. Cl.
*H10B 51/30* (2023.01)
*H10B 51/20* (2023.01)
*H10B 53/20* (2023.01)
*H10B 53/30* (2023.01)

(52) U.S. Cl.
CPC ............. *H10B 51/30* (2023.02); *H10B 51/20* (2023.02); *H10B 53/20* (2023.02); *H10B 53/30* (2023.02)

(58) Field of Classification Search
CPC ........ H10B 51/00; H10B 51/10; H10B 51/20; H10B 51/30; H10B 53/00; H10B 53/10; H10B 53/20; H10B 53/30
See application file for complete search history.

(56) References Cited

U.S. PATENT DOCUMENTS

| | | | | |
|---|---|---|---|---|
| 6,151,240 A | * | 11/2000 | Suzuki | H01L 28/75 |
| | | | | 257/295 |
| 2017/0069841 A1 | * | 3/2017 | Ino | H10N 70/826 |
| 2022/0271046 A1 | * | 8/2022 | Huang | H01L 29/6684 |
| 2022/0344488 A1 | * | 10/2022 | Huang | H01L 29/517 |
| 2022/0344513 A1 | * | 10/2022 | Huang | H01L 29/66969 |
| 2022/0352379 A1 | * | 11/2022 | Lin | H10B 51/30 |

FOREIGN PATENT DOCUMENTS

| | | | | |
|---|---|---|---|---|
| JP | 2008205013 A | * | 9/2008 | |
| KR | 20000042397 A | * | 12/1998 | H01L 28/65 |

OTHER PUBLICATIONS

U.S. Appl. No. 17/394,757, filed Aug. 5, 2021.
(Continued)

*Primary Examiner* — Matthew E Warren
(74) *Attorney, Agent, or Firm* — Eschweiler & Potashnik, LLC

(57) ABSTRACT

Various embodiments of the present disclosure are directed towards an integrated chip including a semiconductor layer overlying a substrate. A ferroelectric layer overlies the substrate. A pair of source/drain structures are disposed on the semiconductor layer. A lower metal layer is disposed along a lower surface of the ferroelectric layer. An upper metal layer is disposed along an upper surface of the ferroelectric layer.

20 Claims, 15 Drawing Sheets

(56) References Cited

OTHER PUBLICATIONS

Kim et al. "Large ferroelectric polarization of TiN/Hf0.5Zr0.5O2/TiN capacitors due to stress-induced crystallization at low thermal budget" Appl. Phys. Lett. 111, 242901 (2017), published on Dec. 12, 2017.

Cao et al. "Effects of Capping Electrode on Ferroelectric Properties of Hf0.5Zr0.5O2 Thin Films" IEEE Electron Device Letters, vol. 39, No. 8, published Aug. 2018.

Kashir et al. "Large remnant polarization in a wake-up free Hf0.5Zr0.5O2 ferroelectric film through bulk and interface engineering" CS Appl. Electron. Mater. 2021, 3, 2, 629-638, published on Jan. 20, 2021.

Cassel et al. "Coefficient of Thermal Expansion Measurement using the TMA 4000" Perkin Elmer, published in 2013.

\* cited by examiner

METAL LAYERS FOR INCREASING POLARIZATION OF FERROELECTRIC MEMORY DEVICE

REFERENCE TO RELATED APPLICATION

This application claims the benefit of U.S. Provisional Application No. 63/278,230, filed on Nov. 11, 2021, the contents of which are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
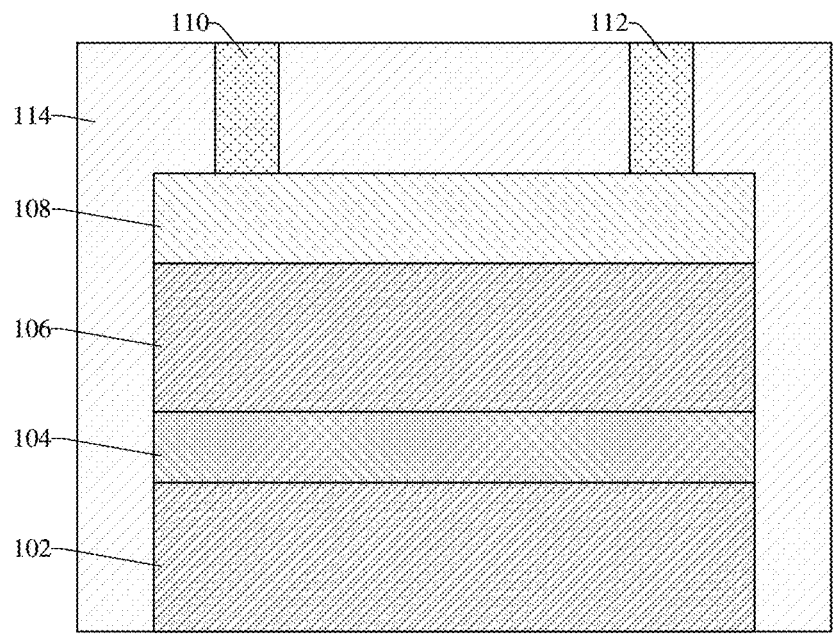
FIG. 1 illustrates a cross-sectional view of some embodiments of a ferroelectric memory device comprising a ferroelectric layer disposed between a lower metal layer and an upper metal layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric field-effect transistor (FeFET) device is a type of ferroelectric random access memory (FeRAM) device that comprises a ferroelectric layer disposed between a gate structure and a semiconductor layer. A pair of source/drain regions are disposed on the semiconductor layer and a channel region may extend along the semiconductor layer between the pair of source/drain regions. During operation of a FeFET device, an application of a gate voltage to the gate structure will generate an electric field that polarizes the ferroelectric layer. For example, by applying a first voltage to the gate structure, the polarization of the ferroelectric layer may be in a first direction. Further, by applying a second voltage to the gate structure, the polarization may be in a second direction that is opposite the first direction. The direction of the polarization corresponds to different data states of the FeFET device, such that the first direction corresponds to a first data state (e.g., logical "0") and the second direction corresponds to a second data state (e.g., logical "1"), or vice versa. A difference between the first voltage and the second voltage defines a memory window of the FeFET device.

A ferroelectric layer has multiple crystal phases such as an orthorhombic phase, cubic phase, and/or tetragonal phase. Increasing a volumetric fraction of the ferroelectric layer that is in the orthorhombic phase may increase the polarization of the ferroelectric layer. The orthorhombic phase of the ferroelectric layer can be increased by increasing tensile stress on the ferroelectric layer. The tensile stress on the ferroelectric layer may be applied by adjacent layers. For example, the gate structure may include a first metal layer disposed on a first side of the ferroelectric layer. By virtue of the first metal layer comprising a metal material, the first metal layer may increase tensile stress on the ferroelectric layer thereby increasing the volumetric fraction of the ferroelectric layer that is in the orthorhombic phase. During fabrication of the FeFET device, the first metal layer may be deposited on the ferroelectric layer, or vice versa, such that the first metal layer is disposed along a first side of the ferroelectric layer. Subsequently, an annealing process is performed on the first metal layer and the ferroelectric layer. However, the first metal layer may be deposited with a relatively thin thickness (e.g., a thickness less than about 50 nanometers (nm)) and may have a high coefficient of thermal expansion (CTE), such that a size of the first metal layer may be decreased after performing the annealing process on the first metal layer. This, in part, may decrease the tensile stress on the ferroelectric layer, and may result in a lower remnant polarization (e.g. 2Pr). The reduced polarization (e.g., reduced remnant polarization) of the ferroelectric layer results in a reduced memory window and endurance of the FeFET device.

Accordingly, various embodiments of the present disclosure relate to an integrated chip having a memory cell that comprises multiple metal layers disposed along opposing surfaces of a ferroelectric layer. The memory cell includes a lower metal layer disposed along a bottom surface of a ferroelectric layer and an upper metal layer disposed along a top surface of the ferroelectric layer. A semiconductor layer is disposed on one of the upper metal layer or the lower metal layer. Further, a pair of source/drain structures is disposed on the semiconductor layer. The upper and lower metal layers respectively have a relatively large thickness (e.g., a thickness equal to or greater than about 50 nm) and have a low CTE. By virtue of the upper and lower metal layers having the relatively large thickness and being disposed on the bottom and top surfaces of the ferroelectric layer, a tensile stress on the ferroelectric layer is increased. Further, due to the low CTE of the upper and lower metal layers, thicknesses of the upper and lower metal layers may not be decreased after performing an annealing process on the ferroelectric layer and the upper and lower metal layers. This facilitates the upper and lower metal layers maintaining the relatively large thickness, thereby maintaining the increased tensile stress on the ferroelectric layer. The increased tensile stress increases a volumetric fraction of the ferroelectric layer that is in the orthorhombic phase, thereby increasing the polarization (e.g., the remnant polarization) of the ferroelectric layer. Increasing the polarization of the ferroelectric layer results in an increase of the memory window and endurance of the memory cell, thereby improving an overall performance of the memory cell.

FIG. 1 illustrates a cross-sectional view of some embodiments of a ferroelectric memory device 100 having a ferroelectric layer 104 disposed between a lower metal layer 102 and an upper metal layer 106.

The lower metal layer 102 is disposed along a bottom surface of the ferroelectric layer 104 and the upper metal layer 106 is disposed along a top surface of the ferroelectric layer 104. A semiconductor layer 108 overlies the upper metal layer 106. A first source/drain structure 110 and a second source/drain structure 112 are disposed on the semiconductor layer 108 and are laterally spaced apart from one another. Further, a dielectric structure 114 overlies the semiconductor layer 108 and laterally encloses the ferroelectric layer 104, the lower metal layer 102, and the upper metal layer 106. The dielectric structure 114 extends from the first source/drain structure 110 to the second source/drain structure 112. In various embodiments, the lower metal layer 102 may be configured as a gate structure and/or a gate electrode.

In some embodiments, by applying suitable voltage bias conditions to the lower metal layer 102, the first source/drain structure 110, and the second source/drain structure 112, a channel region may form in the semiconductor layer 108 and/or an electric field is generated that polarizes the ferroelectric layer 104. In various embodiments, the channel region is disposed laterally between the first source/drain structure 110 and the second source/drain structure 112, such that charge carriers may travel from the first source/drain structure 110 to the second source/drain structure 112, or vice versa. Depending on a value of the voltage bias applied to the lower metal layer 102, a direction of the polarization of the ferroelectric layer 104 may be in a first direction or a second direction that is opposite the first direction. For example, applying a positive voltage to the lower metal layer 102 may result in the polarization having the first direction that represents a first data state (e.g., a logical "0"), while a applying a negative voltage to the lower metal layer 102 may result in the polarization having the second direction that represents a second data state (e.g., a logical "1").

In various embodiments, the lower and upper metal layers 102, 106 have a relatively large thickness (e.g., equal to or greater than about 50 nm) and comprise a metal material (e.g., titanium nitride) with a high crystallinity and a low coefficient of thermal expansion (CTE). By virtue of the lower and upper metal layers 102, 106 having the relatively large thickness and being disposed on the bottom and top surface of the ferroelectric layer 104, a tensile stress on the ferroelectric layer 104 is increased. The increased tensile stress increases a volumetric fraction of the ferroelectric layer 104 that is in the orthorhombic phase, thereby increasing the polarization of the ferroelectric layer 104 and in turn increasing a memory window and endurance of the ferroelectric memory device 100. Further, due to the low CTE of the lower and upper metal layers 102, 106, the thicknesses of the lower and upper metal layers 102, 106 may not be reduced during manufacturing of the ferroelectric memory device 100 (e.g., during an annealing process). This facilitates the lower and upper metal layers 102, 106 maintaining the relatively large thickness, thereby maintaining the increased tensile stress on the ferroelectric layer 104. Thus, by disposing the ferroelectric layer 104 between the lower and upper metal layers 102, 106, an overall performance of the ferroelectric memory device 100 is increased.

In some embodiments, mechanical stress from the lower and upper metal layers 102, 106 on the ferroelectric layer 104 increases the tensile stress on the ferroelectric layer 104. The mechanical stress may comprise stress applied to the ferroelectric layer 104 during deposition of the ferroelectric layer 104 on the lower metal layer 102 and deposition of the upper metal layer 106 on the ferroelectric layer 104, and stress applied to the ferroelectric layer 104 as a result of an annealing process. In an embodiment, as a thickness of the lower and upper metal layers 102, 106 increases mechanical stress applied to the ferroelectric layer 104 increases, thereby increasing the overall tensile stress on the ferroelectric layer 104. In further embodiments, a tensile stress on the ferroelectric layer 104 increases after performing an annealing process on the ferroelectric layer 104 with the lower and upper metal layers 102, 106 in place. In such embodiments, by virtue of the lower and upper metal layers 102, 106 having the relatively large thickness (e.g., equal to or greater than about 50 nm) the lower and upper metal layers 102, 106 inhibit formation of a monoclinic phase in the ferroelectric layer 104 during the annealing process, thereby promoting formation of orthorhombic phase of the ferroelectric layer 104.

Figure 2A:
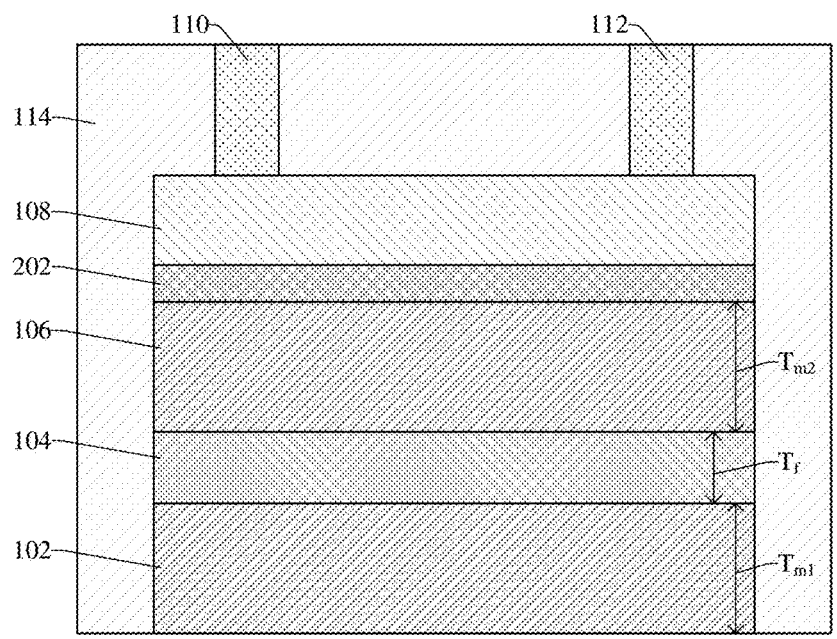
FIGS. 2A and 2B illustrate cross-sectional views of some embodiments of a ferroelectric memory device comprising a lower metal layer, an upper metal layer, a ferroelectric layer disposed between the lower and upper metal layers, and an insulating layer disposed on the upper metal layer.

FIG. 2A illustrates a cross-sectional view of some embodiments of a ferroelectric memory device 200a comprising a lower metal layer 102, an upper metal layer 106, a ferroelectric layer 104 disposed between the lower and upper metal layers 102, 106, and an insulating layer 202 disposed on the upper metal layer 106.

In some embodiments, the ferroelectric memory device 200a comprises a lower metal layer 102, a ferroelectric layer 104, an upper metal layer 106, an insulating layer 202, a semiconductor layer 108, and first and second source/drain structures 110, 112. The ferroelectric layer 104 is disposed vertically between the lower metal layer 102 and the upper metal layer 106. Further, the insulating layer 202 is disposed between a top surface of the upper metal layer 106 and the semiconductor layer 108. The first and second source/drain structures 110, 112 are disposed on the semiconductor layer 108 and are spaced laterally apart from one another. In various embodiments, the semiconductor layer 108 comprises a semiconductor material and a selectively conductive channel region extending laterally from the first source/drain structure 110 to the second source/drain structure 112. In further embodiments, the lower metal layer 102 is configured as a gate electrode that is separated from the selectively conductive channel region by the ferroelectric layer 104. In yet further embodiments, the upper metal layer 106 is configured as a floating electrode.

In various embodiments, the ferroelectric layer 104 may be or comprise hafnium oxide, hafnium-zirconium-oxide (e.g., $Hf_xZr_{1-x}O_y$, $Hf_{0.5}Zr_{0.5}O_2$, etc.), aluminum nitride doped with scandium, hafnium-zirconium-oxide doped with one or more dopants (e.g., aluminum, silicon, lanthanum, scandium, calcium, barium, gadolinium, yttrium, another suitable dopant, or any combination of the foregoing), beryllium oxide, zinc oxide, calcium oxide, strontium oxide, boron oxide, zirconium dioxide, another ferroelectric material, or some other suitable material and has a thickness $T_f$ that is about 12 nm, within a range of about 0.1 nm to 100 nm, or some other suitable value. In various embodiments, the ferroelectric layer 104 has a CTE that is greater than or equal to about $14*10^{-6}$ $K^{-1}$ or another suitable value.

In some embodiments, the lower metal layer 102 and the upper metal layer 106 may be or comprise titanium, titanium nitride, tantalum, tantalum nitride, tungsten, tungsten carbonitride, molybdenum, niobium, platinum, iron, nickel, beryllium, chromium, cobalt, some other suitable metal, or any combination of the foregoing. In further embodiments, the lower metal layer 102 and the upper metal layer 106 respectively comprise a same metal material (e.g., titanium nitride) and/or each have a [111] crystal orientation. In yet further embodiments, the lower metal layer 102 and the upper metal layer 106 may respectively be a composite electrode structure comprising one or more metal layers (e.g., comprising tungsten, tungsten carbonitride, molybdenum, niobium, tantalum, titanium nitride, platinum, etc.) and one or more metal oxide layers (e.g., titanium oxide, tantalum oxide, indium oxide, etc.).

In various embodiments, the lower and upper metal layers 102, 106 respectively have a CTE that is less than about $14*10^{-6}$ $K^{-1}$, within a range of about $1*10^{-6}$ $K^{-1}$ to about $14*10^{-6}$ $K^{-1}$, or another suitable value. In some embodiments, the lower metal layer 102 has a thickness $T_{m1}$ that is greater than about 50 nm, about 90 nm, within a range of about 50 nm to about 500 nm, or another suitable value. In further embodiments, the upper metal layer 106 has a thickness $T_{m2}$ that is greater than about 50 nm, about 90 nm, about 180 nm, within a range of about 50 nm to about 500 nm, or another suitable value. In yet further embodiments, the thickness $T_{m1}$ of the lower metal layer 102 is less than the thickness $T_{m2}$ of the upper metal layer 106. In such embodiments, by virtue of the thickness $T_{m2}$ of the upper metal layer 106 being greater than the thickness $T_{m1}$ of the lower metal layer 102, the upper metal layer 106 may maintain or increase tensile stress on the ferroelectric layer 104 while decreasing costs associated with forming the lower metal layer 102. For example, the thickness $T_{m1}$ of the lower metal layer 102 may be about 90 nm and the thickness $T_{m2}$ of the upper metal layer 106 may be about 180 nm. In some embodiments, the thickness $T_{m1}$ of the lower metal layer 102 is equal to the thickness $T_{m2}$ of the upper metal layer 106. Due to the lower and upper metal layers 102, 106 having the CTE less than the CTE of the ferroelectric layer 104, the thicknesses $T_{m1}$, $T_{m2}$ of the lower and upper metal layers 102, 106 may not be decreased while performing an annealing process on the ferroelectric layer 104 and the lower and upper metal layers 102, 106. This facilitates the lower and upper metal layers 102, 106 maintaining the relatively large thicknesses $T_{m1}$, $T_{m2}$, thereby maintaining an increased tensile stress on the ferroelectric layer 104. The increased tensile stress increases a volumetric fraction of the ferroelectric layer 104 that is in the orthorhombic phase, thereby increasing the polarization (e.g., the remnant polarization) of the ferroelectric layer 104 and resulting in an increased memory window and endurance of the ferroelectric memory device 200a. Accordingly, in various embodiments, if the thicknesses $T_{m1}$, $T_{m2}$ of the lower and upper metal layers 102, 106 are respectively about 50 nm or more (e.g., within a range of about 50 to 500 nm), then a tensile stress on the ferroelectric layer 104 is increased, thereby increasing the polarization of the ferroelectric layer 104.

In some embodiments, the insulating layer 202 may be or comprise hafnium oxide doped with silicon, aluminum, silicon, magnesium, silicon dioxide, silicon nitride, yttrium oxide, nitrogen, another suitable material, or any combination of the foregoing and/or has a thickness within a range of about 0.1 nm to about 10 nm, or another suitable thickness value. Further, the insulating layer 202 is configured to reduce leakage current and/or reduce oxygen vacancies in the semiconductor layer 108. The reduced oxygen vacancies may mitigate charge carrier scattering in the semiconductor layer 108. In yet further embodiments, the insulating layer 202 may be referred to as a blocking layer. In further embodiments, the semiconductor layer 108 may be or comprise amorphous indium-gallium-zinc-oxide (e.g., a-IGZO), gallium arsenide, gallium nitride, aluminum gallium arsenide, some indium-gallium-zinc-oxide compound containing tin, some compound semiconductor material, amorphous silicon, polycrystalline silicon, graphene, or some other suitable material. The semiconductor layer 108 may have a thickness within a range of about 0.1 nm to about 100 nm or another suitable thickness value. In yet further embodiments, the first and second source/drain structures 110, 112 may be or comprise aluminum, titanium, tantalum, tungsten, ruthenium, gold, copper, some other suitable conductive material, or any combination of the foregoing. In various embodiments, the dielectric structure 114 may be or comprise silicon dioxide, silicon carbide, silicon nitride, a low-k dielectric material, another suitable dielectric material, or any combination of the foregoing.

Figure 2B:
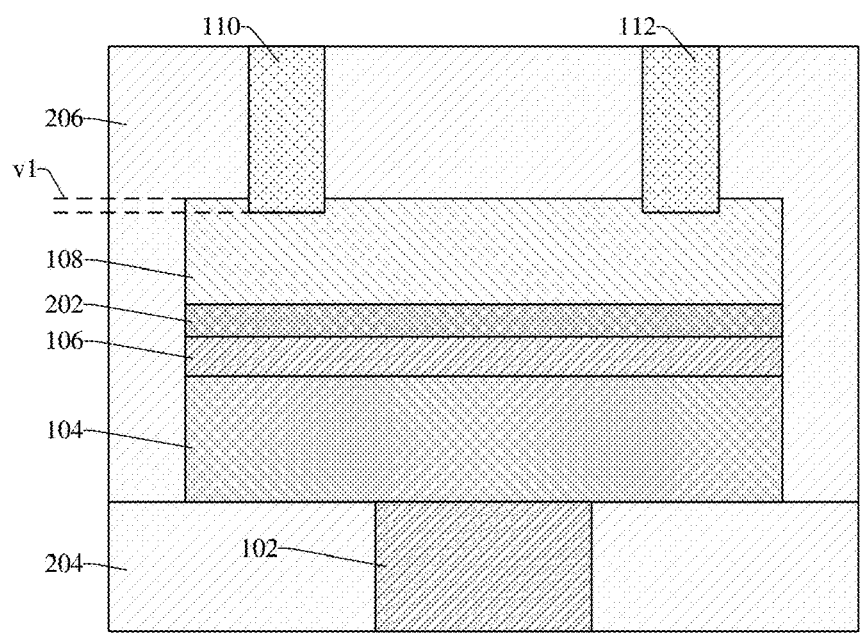

FIG. 2B illustrates a cross-sectional view of some embodiments of a ferroelectric memory device 200b according to various embodiments of the ferroelectric memory device 200a of FIG. 2A.

The ferroelectric memory device 200b comprises a lower dielectric layer 204 and an upper dielectric layer 206 disposed along the lower dielectric layer 204. The lower metal layer 102 is disposed within the lower dielectric layer 204 and has opposing sidewalls that are spaced between opposing sidewalls of the ferroelectric layer 104. In various embodiments, a width of the lower metal layer 102 is less than a width of the upper metal layer 106. In further embodiments, bottom surfaces of the first and second source/drain structures 110, 112 are disposed below a top surface of the semiconductor layer 108 by a vertical distance v1. In some embodiments, the vertical distance v1 is non-zero. In such embodiments, by virtue of bottom surfaces of the first and second source/drain structures 110, 112 being disposed below the top surface of the semiconductor layer 108 contact resistance between the semiconductor layer 108 and the first and second source/drain structures 110, 112 may be reduced, thereby increasing performance of the ferroelectric memory device 200b.

Figure 3:
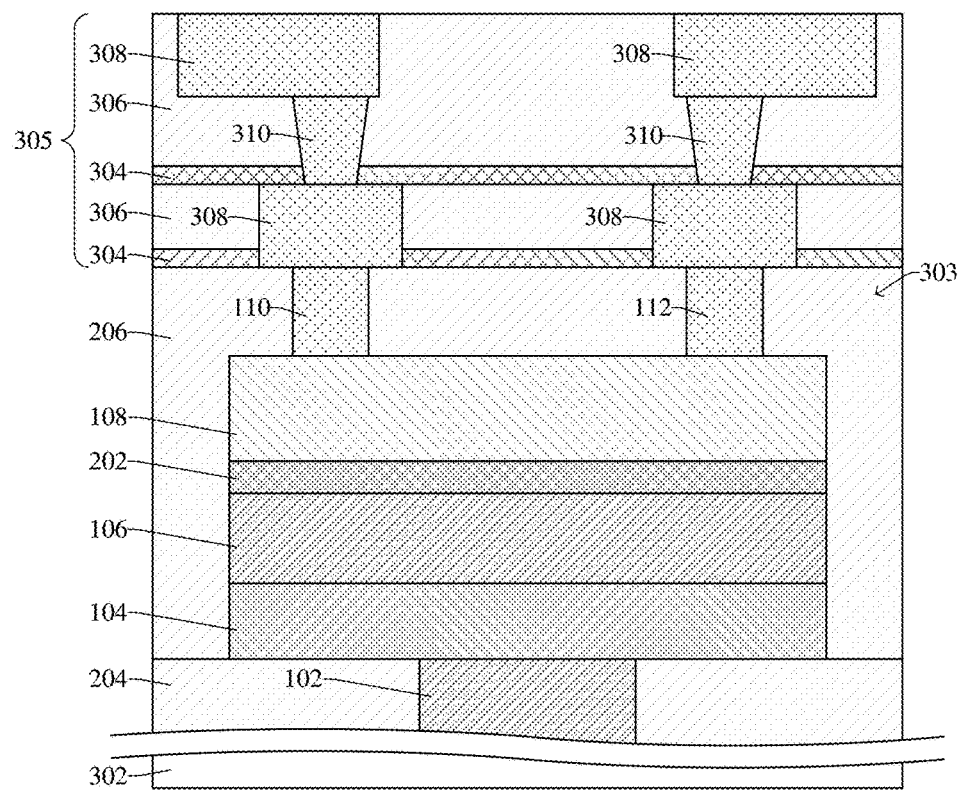
FIG. 3 illustrates a cross-sectional view of some embodiments of an integrated chip comprising a ferroelectric memory device having a ferroelectric layer disposed between a lower metal layer and an upper metal layer.

FIG. 3 illustrates a cross-sectional view of some embodiments of an integrated chip 300 comprising a ferroelectric memory device 303 having a ferroelectric layer 104 disposed between a lower metal layer 102 and an upper metal layer 106.

The integrated chip 300 comprises the ferroelectric memory device 303 disposed over a substrate 302 and an interconnect structure 305 disposed over the ferroelectric memory device 303. In various embodiments, the ferroelectric memory device 303 comprises a lower metal layer 102, a ferroelectric layer 104, an upper metal layer 106, an insulating layer 202, a semiconductor layer 108, a first source/drain structure 110, and a second source/drain structure 112. The interconnect structure 305 comprises a plurality of conductive wires 308 and a plurality of conductive vias 310 disposed within an interconnect dielectric structure. The plurality of conductive wires 308 and the plurality of conductive vias 310 are electrically coupled to the first and second source/drain structures 110, 112. Further, the interconnect dielectric structure comprises a plurality of intermetal dielectric (IMD) layers 306 and a plurality of etch stop layers 304. In some embodiments, the IMD layers 306 may be or comprise silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, any combination of the foregoing, or the like. In various embodiments, the etch stop layers 304 may be or comprise a carbide (e.g., silicon carbide, silicon oxycarbide, or the like), a nitride (e.g., silicon nitride, silicon oxynitride, or the like), any combination of the foregoing, or the like.

Figure 4:
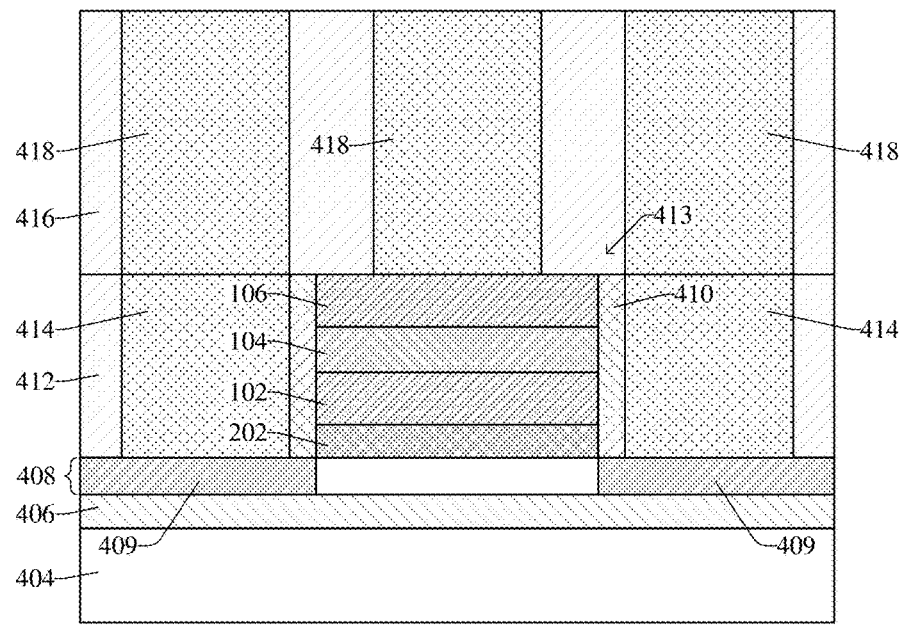
FIGS. 4 and 5 illustrate cross-sectional views of some different embodiments of an integrated chip comprising a ferroelectric layer disposed over a semiconductor layer and an upper metal layer disposed along the ferroelectric layer.

FIG. 4 illustrates a cross-sectional view of some embodiments of an integrated chip 400 comprising a ferroelectric layer 104 disposed over a semiconductor layer 408 and an upper metal layer 106 disposed along the ferroelectric layer 104.

The integrated chip 400 includes a dielectric structure 406 overlying a substrate 404 and the semiconductor layer 408 disposed along the dielectric structure 406. In various embodiments, the substrate 404, the dielectric structure 406, and the semiconductor layer 408 may be part of a silicon-on-insulator (SOI) substrate. Further, the semiconductor layer 408 may be configured as the semiconductor layer 108 of FIGS. 1, 2A, 2B, or 3. A gate structure 413 overlies the substrate 404. In various embodiments, the gate structure 413 comprises an insulating layer 202, a lower metal layer 102, a ferroelectric layer 104, and an upper metal layer 106. A pair of source/drain regions 409 are disposed within the semiconductor layer 408 on opposing sides of the gate structure 413. In some embodiments, the semiconductor layer 408 comprises a first doping type (e.g., p-type) and the source/drain regions 409 comprise a second doping type (e.g., n-type) opposite the first doping type. Further, a sidewall spacer structure 410 is disposed along opposing sidewalls of the gate structure 413. The sidewall spacer structure 410 may, for example, be or comprise silicon nitride, silicon dioxide, another suitable dielectric material, or any combination of the foregoing.

A first dielectric layer 412 overlies the semiconductor layer 408 and laterally encloses the gate structure 413. Source/drain contacts 414 are disposed within the first dielectric layer 412 and overlie the source/drain regions 409. A second dielectric layer 416 overlies the first dielectric layer 412. A plurality of conductive structures 418 is disposed within the second dielectric layer 416 and overlies the source/drain contacts 414 and the gate structure 413. In various embodiments, the conductive structures 418 may be configured as conductive wires or conductive vias. In further embodiments, the upper metal layer 106 may be referred to as a gate electrode, the lower metal layer 102 may be referred to as a floating electrode, and the source/drain regions 409 may be referred to as source/drain structures.

Figure 5:
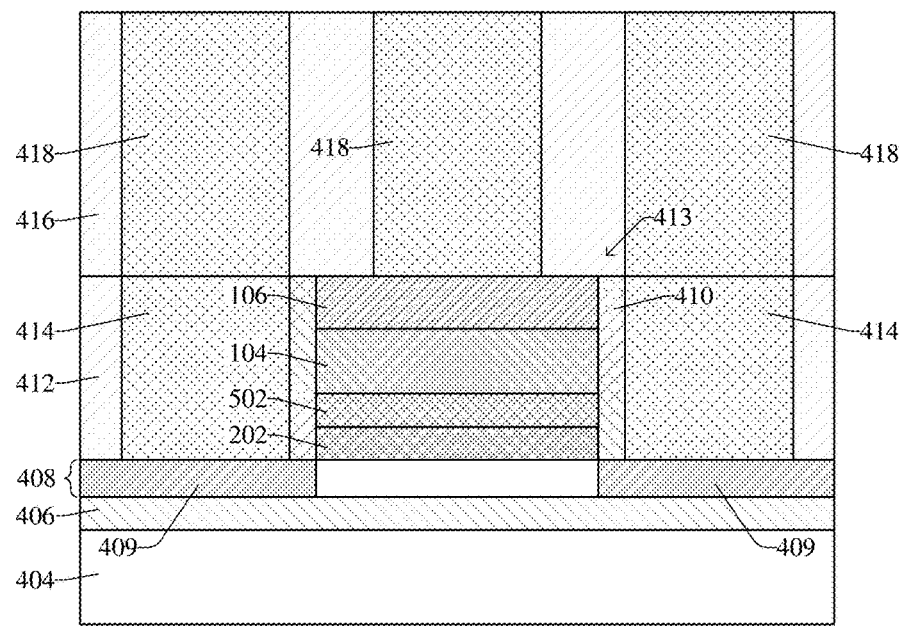

FIG. 5 illustrates a cross-sectional view of some embodiments of an integrated chip 500 according to various embodiments of the integrated chip 400 of FIG. 4, in which a seed layer 502 is disposed between the ferroelectric layer 104 and the semiconductor layer 408. The seed layer 502 is configured to promote a formation of orthorhombic phase crystals in the ferroelectric layer 104, thereby further increasing the polarization (e.g., the remnant polarization) of the ferroelectric layer 104. In various embodiments, the seed layer 502 may be or comprise aluminum nitride, hafnium oxide, zirconium oxide, aluminum oxide, silicon dioxide, silicon, aluminum, another suitable material, or any combination of the foregoing.

FIGS. 6-12 illustrate cross-sectional views 600-1200 of some embodiments of a method for forming an integrated chip with a ferroelectric memory device having a ferroelectric layer disposed between a lower metal layer and an upper metal layer according to aspects of the present disclosure. Although the cross-sectional views 600-1200 shown in FIGS. 6-12 are described with reference to a method, it will be appreciated that the structures shown in FIGS. 6-12 are not limited to the method but rather may stand alone separate of the method. Furthermore, although FIGS. 6-12 are described as a series of acts, it will be appreciated that these acts are not limiting in that the order of the acts can be altered in other embodiments, some acts that are illustrated and/or described may be omitted in whole or in part.

Figure 6:
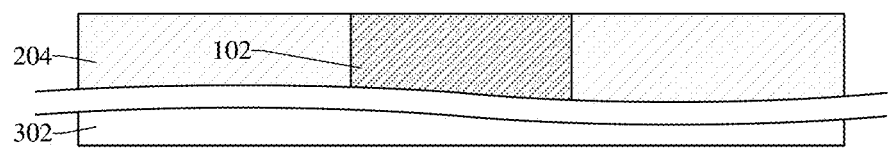
FIGS. 6-12 illustrate cross-sectional views of some embodiments of a method for forming an integrated chip with a ferroelectric memory device having a ferroelectric layer disposed between a lower metal layer and an upper metal layer.

As shown in cross-sectional view 600 of FIG. 6, a lower metal layer 102 is formed over a substrate 302. Further, a lower dielectric layer 204 is formed over the substrate 302. In some embodiments, a process for forming the lower metal layer 102 comprises: depositing (e.g., by chemical vapor deposition (CVD), physical vapor deposition (PVD), atomic layer deposition (ALD), etc.) the lower dielectric layer 204 over the substrate 302; forming a masking layer (not shown) over the lower dielectric layer 204; patterning the lower dielectric layer 204 according to the masking layer to define an opening within the lower dielectric layer 204; depositing (e.g., by CVD, PVD, ALD, sputtering, electroplating, etc.) a metal material (e.g., titanium nitride) over the lower dielectric layer 204, thereby filling the opening; and performing a planarization process (e.g., a chemical mechanical polishing (CMP) process) on the metal material, thereby defining the lower metal layer 102. In some embodiments, the planarization process is performed such that an upper surface of the lower metal layer 102 is co-planar with an upper surface of the lower dielectric layer 204.

In some embodiments, the lower metal layer 102 may be or comprise titanium, titanium nitride, tantalum, tantalum nitride, tungsten, tungsten carbonitride, molybdenum, niobium, platinum, iron, nickel, beryllium, chromium, cobalt, some other suitable metal, or any combination of the foregoing and is formed to have a thickness that is greater than 50 nm, about 90 nm, within a range of about 50 nm to about 500 nm, or another suitable value. In various embodiments, the lower metal layer 102 has a relatively low CTE that is less than about $14*10^{-6}$ $K^{-1}$, within a range of about $1*10^{-6}$ $K^{-1}$ to about $14*10^{-6}$ $K^{-1}$, or another suitable value.

Figure 7:
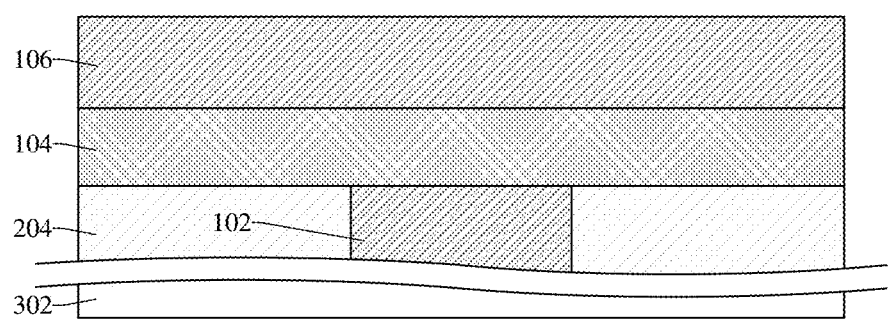

As shown in cross-sectional view 700 of FIG. 7, a ferroelectric layer 104 is formed over the lower metal layer 102 and an upper metal layer 106 is formed over the ferroelectric layer 104. In some embodiments, the ferroelectric layer 104 is formed by depositing the ferroelectric layer 104 over the lower metal layer 102 by a CVD process, a PVD process, an ALD process, or another suitable growth or deposition process. In yet further embodiments, the upper metal layer 106 is formed by depositing the upper metal layer 106 along an upper surface of the ferroelectric layer 104 by a CVD process, a PVD process, an ALD process, sputtering, electroplating, or another suitable deposition or growth process.

In some embodiments, the ferroelectric layer 104 may be or comprise hafnium oxide, hafnium-zirconium-oxide (e.g., $Hf_xZr_{1-x}O_y$, $Hf_{0.5}Zr_{0.5}O_2$, etc.), aluminum nitride doped with scandium, hafnium-zirconium-oxide doped with one or more dopants (e.g., aluminum, silicon, lanthanum, scandium, calcium, barium, gadolinium, yttrium, another suitable dopant, or any combination of the foregoing), beryllium oxide, zinc oxide, calcium oxide, strontium oxide, boron oxide, zirconium dioxide, another ferroelectric material, or some other suitable material and is formed to have a thickness that is about 12 nm, within a range of about 0.1 nm to 100 nm, or some other suitable value. In various embodiments, the ferroelectric layer 104 has a relatively high CTE that is greater than or equal to about $14*10^{-6}$ $K^{-1}$ or another suitable value.

In some embodiments, the upper metal layer 106 may be or comprise titanium, titanium nitride, tantalum, tantalum nitride, tungsten, tungsten carbonitride, molybdenum, niobium, platinum, iron, nickel, beryllium, chromium, cobalt, some other suitable metal, or any combination of the foregoing and is formed to have a thickness that is greater than 50 nm, about 90 nm, within a range of about 50 nm to about 500 nm, or another suitable value. In various embodiments, the upper metal layer 106 has a relatively low CTE that is less than about $14*10^{-6}$ $K^{-1}$, within a range of about $1*10^{-6}$ $K^{-1}$ to about $14*10^{-6}$ $K^{-1}$, or another suitable value. In further embodiments, the lower metal layer 102 and the upper metal layer 106 respectively comprise a same metal material (e.g., titanium nitride) and/or each have a [111] crystal orientation. In yet further embodiments, the lower metal layer 102 and the upper metal layer 106 may respectively be a composite electrode structure comprising one or more metal layers (e.g., comprising tungsten, tungsten carbonitride, molybdenum, niobium, tantalum, titanium nitride, platinum, etc.) and one or more metal oxide layers (e.g., titanium oxide, tantalum oxide, indium oxide, etc.). By virtue of thicknesses, metal material, and locations of the lower and upper metal layers 102, 106, a tensile stress on the ferroelectric layer 104 is increased, thereby increasing a polarization of the ferroelectric layer 104.

In various embodiments, an annealing process is performed after forming the upper metal layer 106 on the ferroelectric layer 104. In various embodiments, the annealing process includes exposing the lower metal layer 102, the ferroelectric layer 104, and the upper metal layer 106 to high temperatures (e.g., heating the aforementioned layers in an environment of about 300 to 700 degrees Celsius) for a duration of about 20 seconds, within a range of about 10 to 30 seconds, within a range of about 1 to 18,000 seconds, or another suitable value. In various embodiments, the annealing process includes performing a rapid thermal anneal (RTA) process (e.g., exposing layers to heat within a range of about 300 to 700 degrees Celsius for a duration of about 20 seconds, within a range of about 10 to 20 seconds, or another suitable value), a furnace anneal process (e.g., exposing layers to heat within a range of about 300 to 700 degrees Celsius for a duration of about 30 to 18,000 seconds, or another suitable value), or another suitable annealing process. In yet further embodiments, after the annealing process a fast cooling process is performed on the lower metal layer 102, the ferroelectric layer 104, and the upper metal layer 106, where the fast cooling process includes reducing a temperature of an environment of the aforementioned layers to about 150 to 0 degrees Celsius within about 20 seconds or another suitable time. For example, the fast cooling process comprises reducing an ambient temperature in which the lower metal layer 102, the ferroelectric layer 104, and the upper metal layer 106 are disposed in from a final temperature (e.g., about 300 to 700 degrees Celsius) of the annealing process to a low temperature (e.g., about 150 to 0 degrees Celsius) within about 20 seconds or less. Due to the low CTE of the lower and upper metal layers 102, 106, the thicknesses of the lower and upper metal layers 102, 106 are mitigated from being reduced during the annealing process and the fast cooling process. This facilitates the lower and upper metal layers 102, 106 maintaining their relatively large thicknesses, thereby maintaining the increased tensile stress on the ferroelectric layer 104. In yet further embodiments, the tensile stress applied on the ferroelectric layer 104 by adjacent layers (e.g., the lower and upper metal layers 102, 106) is within a range of about 20 to 30 gigapascal (GPa), or another suitable value.

Figure 8:
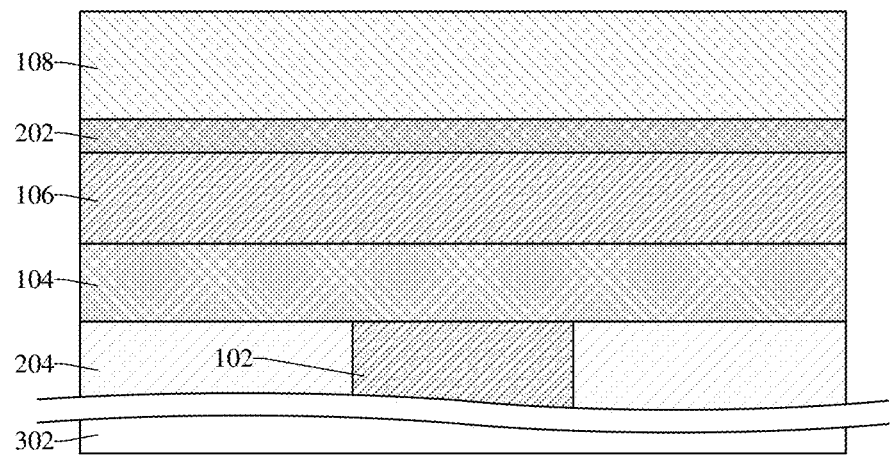

As shown in cross-sectional view 800 of FIG. 8, an insulating layer 202 is formed over the upper metal layer 106 and a semiconductor layer 108 is formed over the insulating layer 202. In some embodiments, the insulating layer 202 is formed by depositing the insulating layer 202 over the upper metal layer 106 by a CVD process, a PVD process, an ALD process, or another suitable deposition or growth process. In further embodiments, the semiconductor layer 108 is formed by depositing the semiconductor layer 108 over the insulating layer 202 by a CVD process, a PVD process, an ALD process, or another suitable deposition or growth process. In various embodiments, the insulating layer 202 may be or comprise hafnium oxide doped with silicon, aluminum, silicon, magnesium, silicon dioxide, silicon nitride, yttrium oxide, nitrogen, another suitable material, or any combination of the foregoing and is formed to a thickness within a range of about 0.1 nm to about 10 nm, or another suitable thickness value. In yet further embodiments, the semiconductor layer 108 may be or comprise amorphous indium-gallium-zinc-oxide (e.g., a-IGZO), gallium arsenide, gallium nitride, aluminum gallium arsenide, some indium-gallium-zinc-oxide compound containing tin, some compound semiconductor material, amorphous silicon, polycrystalline silicon, graphene, or some other suitable material.

Figure 9:
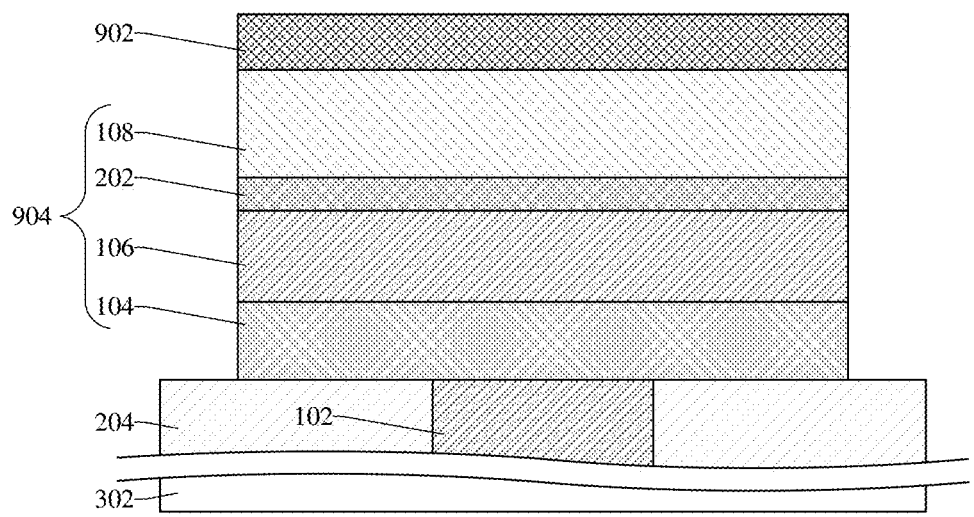

As shown in cross-sectional view 900 of FIG. 9, a patterning process is performed on the ferroelectric layer 104, the upper metal layer 106, the insulating layer 202, and the semiconductor layer 108, thereby defining a memory cell stack 904. In various embodiments, the patterning process comprises: forming a masking layer 902 over the semiconductor layer 108; performing an etching process (e.g., a wet etching process and/or a dry etching process) on the semiconductor layer 108, the insulating layer 202, the upper metal layer 106, and the ferroelectric layer 104 according to the masking layer 902, thereby defining the memory cell stack 904; and performing a removal process (not shown) to remove the masking layer 902 from over the semiconductor layer 108.

Figure 10:
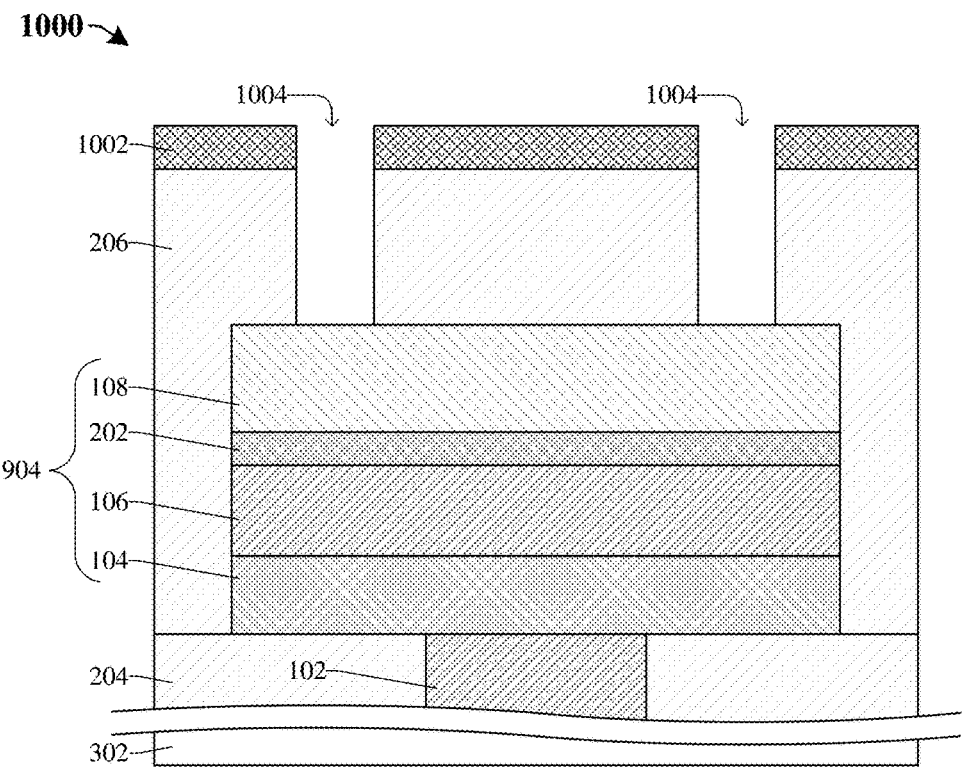

As shown in cross-sectional view 1000 of FIG. 10, an upper dielectric layer 206 is formed over the semiconductor layer 108 and a patterning process is performed on the upper dielectric layer 206 to form openings 1004 that expose an upper surface of the semiconductor layer 108. In some embodiments, the upper dielectric layer 206 is formed by depositing the upper dielectric layer 206 on an upper surface and sidewalls of the memory cell stack 904 by a CVD process, a PVD process, an ALD process, or another suitable deposition or growth process. In various embodiments, the patterning process comprises: forming a masking layer 1002 over the upper dielectric layer 206; performing an etching process (e.g., a wet etching process and/or a dry etching process) on the upper dielectric layer 206 according to the masking layer 1002, thereby defining the openings 1004; and performing a removal process (not shown) to remove the masking layer 1002 from over the upper dielectric layer 206.

Figure 11:
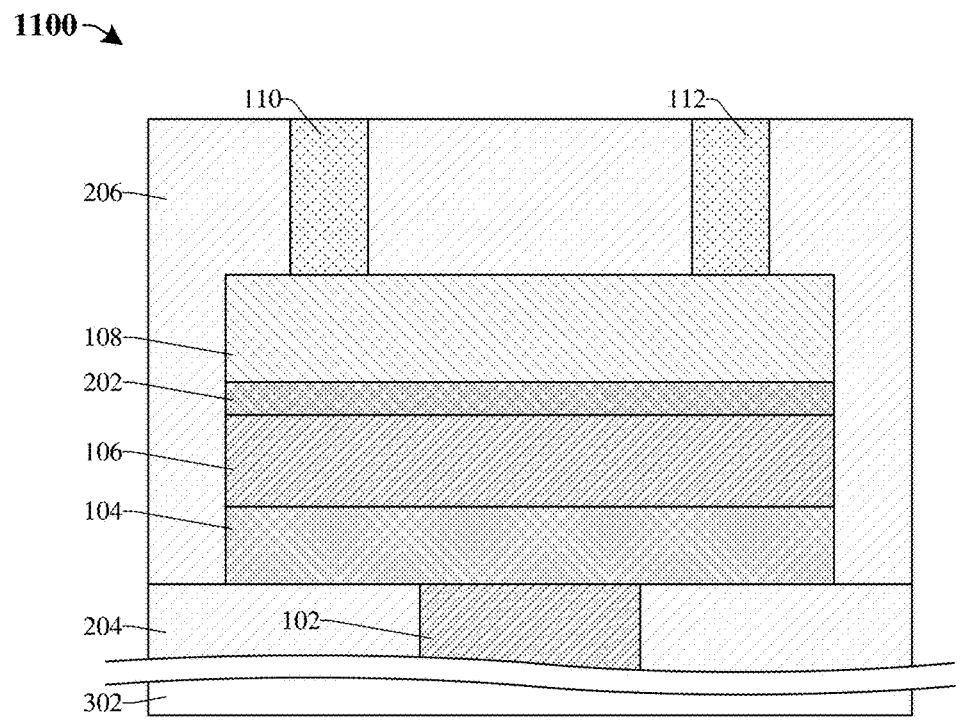

As shown in cross-sectional view 1100 of FIG. 11, a first source/drain structure 110 and a second source/drain structure 112 are formed over the semiconductor layer 108 and within the openings (1004 of FIG. 10). In some embodiments, a process for forming the first and second source/drain structures 110, 112 comprises: depositing (e.g., by a CVD process, a PVD process, an ALD process, etc.) a metal material over the upper dielectric layer 206 such that the metal material fills the openings (1004 of FIG. 10); and performing a planarization process (e.g., a CMP process) on the metal material, thereby defining the first and second source/drain structures 110, 112. In various embodiments, the planarization process is performed such that that an upper surface of the upper dielectric layer 206 is co-planar with upper surfaces of the first and second source/drain structures 110, 112. In further embodiments, the first and second source/drain structures 110, 112 may be or comprise aluminum, titanium, tantalum, tungsten, ruthenium, gold, copper, another conductive material, or any combination of the foregoing.

Figure 12:
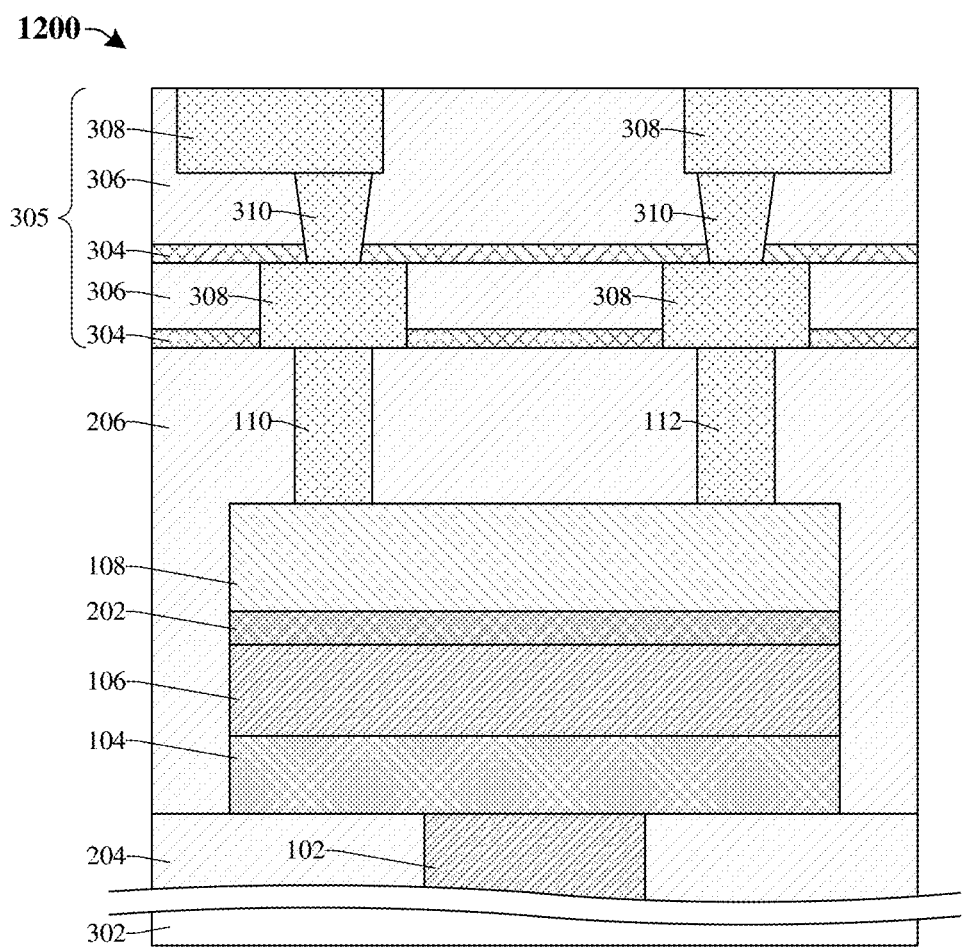

As shown in cross-sectional view 1200 of FIG. 12, an interconnect structure 305 is formed over the first and second source/drain structures 110, 112. The interconnect structure 305 comprises a plurality of inter-metal dielectric (IMD) layers 306, a plurality of etch stop layers 304, a plurality of conductive wires 308, and a plurality of conductive vias 310. In some embodiments, the plurality of IMD layers 306 and the plurality of etch stop layers 304 may be formed by way of a CVD process, a PVD process, an ALD process, or another suitable growth or deposition process. In yet further embodiments, the plurality of conductive wires 308 and the plurality of conductive vias 310 may be formed by a single damascene process, a dual damascene process, or another suitable fabrication process.

Figure 13:
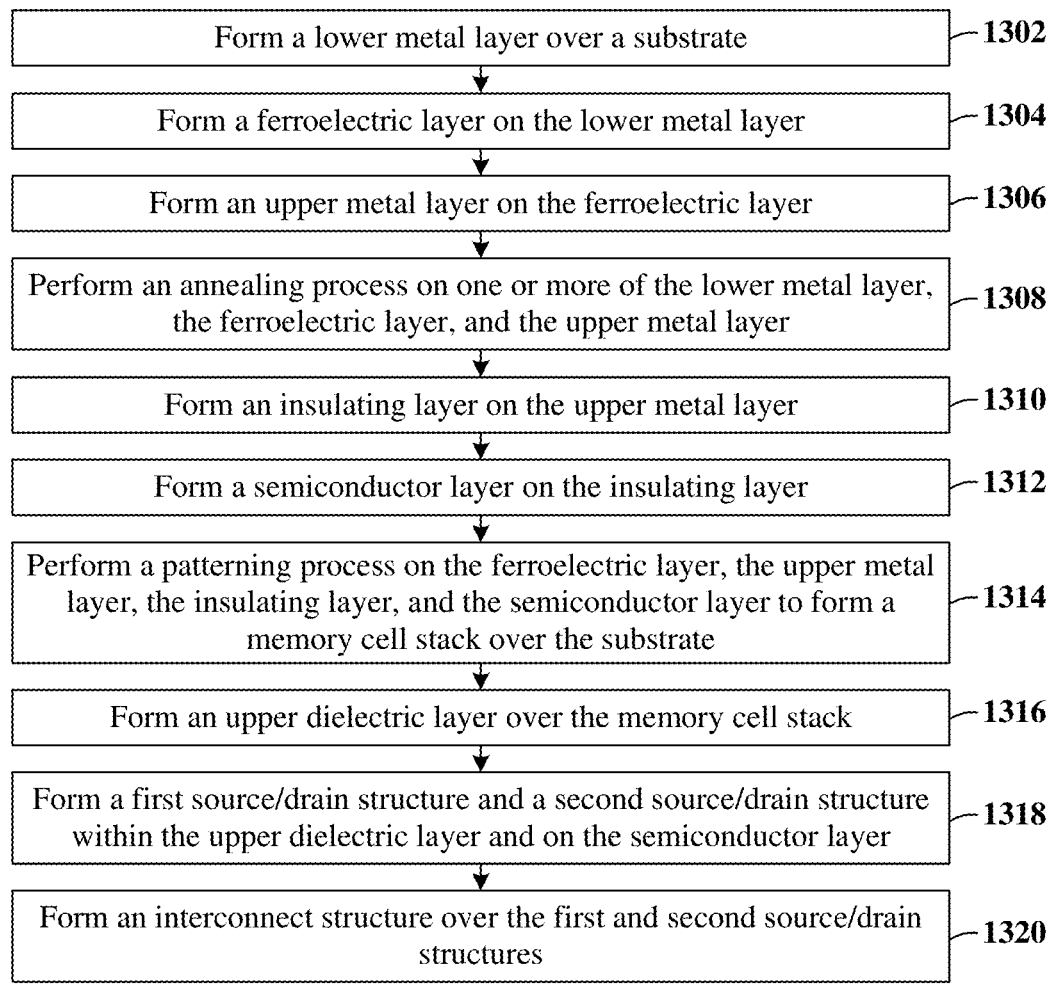
FIG. 13 illustrates a flow diagram of some embodiments of a method for forming an integrated chip with a ferroelectric memory device having a ferroelectric layer disposed between a lower metal layer and an upper metal layer.

FIG. 13 illustrates a flow diagram 1300 of some embodiments of a method for forming an integrated chip with a ferroelectric memory device having a ferroelectric layer disposed between a lower metal layer and an upper metal layer according to aspects of the present disclosure. Although the flow diagram 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, a lower metal layer is formed over a substrate. FIG. 6 illustrates a cross-sectional view 600 corresponding to some embodiments of act 1302.

At act 1304, a ferroelectric layer is formed on the lower metal layer. FIG. 7 illustrates a cross-sectional view 700 corresponding to some embodiments of act 1304.

At act 1306, an upper metal layer is formed on the ferroelectric layer. FIG. 7 illustrates a cross-sectional view 700 corresponding to some embodiments of act 1306.

At act 1308, an annealing process is performed on one or more of the lower metal layer, the ferroelectric layer, and the upper metal layer. FIG. 7 illustrates a cross-sectional view 700 corresponding to some embodiments of act 1308.

At act 1310, an insulating layer is formed on the upper metal layer. FIG. 8 illustrates a cross-sectional view 800 corresponding to some embodiments of act 1310.

At act 1312, a semiconductor layer is formed on the insulating layer. FIG. 8 illustrates a cross-sectional view 800 corresponding to some embodiments of act 1312.

At act 1314, a patterning process is performed on the ferroelectric layer, the upper metal layer, the insulating layer, and the semiconductor layer to form a memory cell stack over the substrate. FIG. 9 illustrates a cross-sectional view 900 corresponding to some embodiments of act 1314.

At act 1316, an upper dielectric layer is formed over the memory cell stack. FIG. 10 illustrates a cross-sectional view 1000 corresponding to some embodiments of act 1316.

At act 1318, a first source/drain structure and a second source/drain structure are formed within the upper dielectric layer and on the semiconductor layer. FIGS. 10 and 11 illustrate cross-sectional views 1000 and 1100 corresponding to some embodiments of act 1318.

At act 1320, an interconnect structure is formed over the first and second source/drain structures. FIG. 12 illustrates a cross-sectional view 1200 corresponding to some embodiments of act 1320.

FIGS. 14-24 illustrate cross-sectional views 1400-2400 of some embodiments of a method for forming an integrated chip comprising a ferroelectric layer disposed over a semiconductor layer and an upper metal layer disposed along the ferroelectric layer according to aspects of the present disclosure. Although the cross-sectional views 1400-2400 shown in FIGS. 14-24 are described with reference to a method, it will be appreciated that the structures shown in FIGS. 14-24 are not limited to the method but rather may stand alone separate of the method. Furthermore, although FIGS. 14-24 are described as a series of acts, it will be appreciated that these acts are not limiting in that the order of the acts can be altered in other embodiments, some acts that are illustrated and/or described may be omitted in whole or in part.

Figure 14:
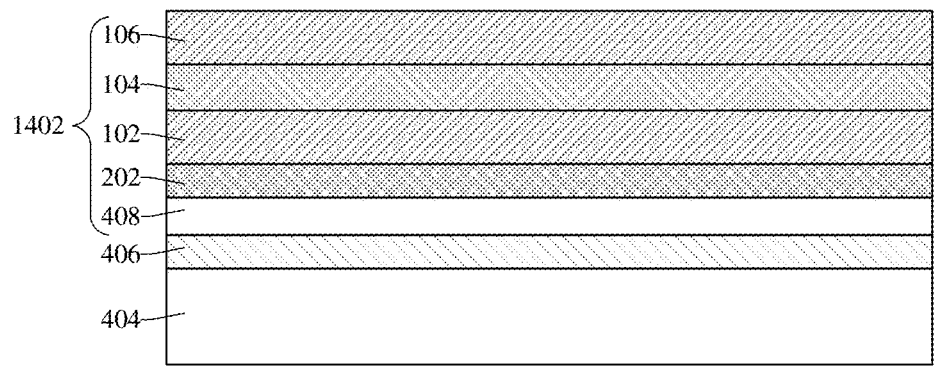
FIGS. 14-24 illustrate cross-sectional views of some embodiments of a method for forming an integrated chip comprising a ferroelectric layer disposed over a semiconductor layer and an upper metal layer disposed along the ferroelectric layer.

As shown in cross-sectional view 1400 of FIG. 14, a dielectric structure 406 is formed over a substrate 404 and a multi-layer stack 1402 is formed on the dielectric structure 406. In various embodiments, a process for forming the multi-layer stack 1402 comprises: depositing a semiconductor layer 408 on the dielectric structure 406; depositing an insulating layer 202 on the semiconductor layer 408; depositing a lower metal layer 102 on the insulating layer 202; depositing a ferroelectric layer 104 on the lower metal layer 102; and depositing an upper metal layer 106 on the ferroelectric layer 104. In some embodiments, the dielectric structure 406, the semiconductor layer 408, the insulating layer 202, the lower metal layer 102, the ferroelectric layer 104, and the upper metal layer 106 may respectively be deposited by one or more deposition process(es) such as a PVD process, a CVD process, an ALD process, another suitable deposition process, or any combination of the foregoing.

In some embodiments, the semiconductor layer 408 may be or comprise amorphous indium-gallium-zinc-oxide (e.g., a-IGZO), gallium arsenide, gallium nitride, aluminum gallium arsenide, some indium-gallium-zinc-oxide compound containing tin, some compound semiconductor material, amorphous silicon, polycrystalline silicon, or some other suitable material. In further embodiments, the insulating layer 202 may be or comprise silicon dioxide, silicon nitride, hafnium oxide, some other suitable material, or any combination of the foregoing. In yet further embodiments, the lower metal layer 102 may be or comprise titanium, titanium nitride, tantalum, tantalum nitride, tungsten, iron, nickel, beryllium, chromium, cobalt, some other suitable metal, or any combination of the foregoing and is formed to have a thickness that is greater than 50 nm, about 90 nm, within a range of about 50 nm to about 500 nm, or another suitable value. In various embodiments, the ferroelectric layer 104 may be or comprise hafnium oxide, hafnium-zirconium-oxide (e.g., $Hf_xZr_{1-x}O_y$, $Hf_{0.5}Zr_{0.5}O_2$, etc.), or some other suitable material and is formed to have a thickness that is about 12 nm, within a range of about 5 nm to 90 nm, or some other suitable value. In some embodiments, the upper metal layer 106 may be or comprise titanium, titanium nitride, tantalum, tantalum nitride, tungsten, iron, nickel, beryllium, chromium, cobalt, some other suitable metal, or any combination of the foregoing and is formed to have a thickness that is greater than 50 nm, about 90 nm, within a range of about 50 nm to about 500 nm, or another suitable value.

Figure 15:
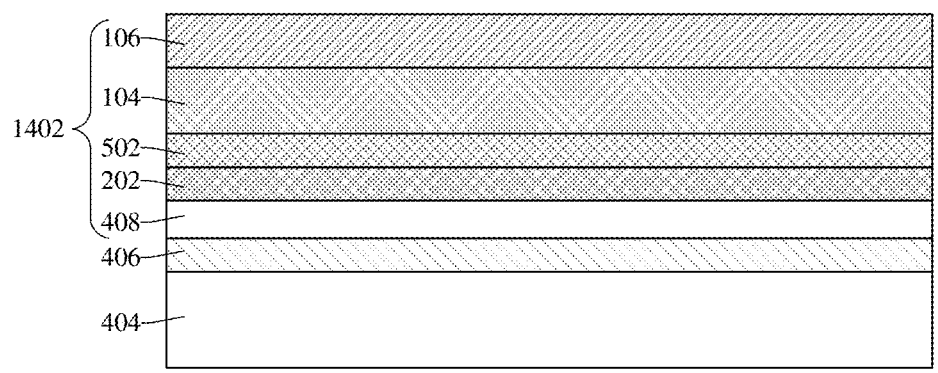

FIG. 15 illustrates a cross-sectional view 1500 of some embodiments of processing steps that may be performed in place of the processing steps of FIG. 14. A first embodiment of the method may proceed from FIG. 14 to FIGS. 16-24 (i.e., skipping FIG. 15), while a second embodiment of the method may include the processing steps illustrated and/or described in FIGS. 15-24.

As shown in cross-sectional view 1500 of FIG. 15, a dielectric structure is formed over a substrate 404 and a multi-layer stack 1402 is formed on the dielectric structure 406. In various embodiments, a process for forming the multi-layer stack 1402 comprises: depositing a semiconductor layer 408 on the dielectric structure 406; depositing an insulating layer 202 on the semiconductor layer 408; depositing a seed layer 502 on the insulating layer 202; depositing a ferroelectric layer 104 on the seed layer 502; and depositing an upper metal layer 106 on the ferroelectric layer 104. In some embodiments, the dielectric structure 406, the semiconductor layer 408, the insulating layer 202, the seed layer 502, the ferroelectric layer 104, and the upper metal layer 106 may respectively be deposited by one or more deposition process(es) such as a PVD process, a CVD process, an ALD process, another suitable deposition process, or any combination of the foregoing. Thus, in various embodiments, the multi-layer stack 1402 may be formed such that the lower metal layer (102 of FIG. 14) is omitted and the seed layer 502 is formed between the insulating layer 202 and the ferroelectric layer 104. In various embodiments, the seed layer 502 may be or comprise aluminum nitride, hafnium oxide, zirconium oxide, aluminum oxide, silicon dioxide, silicon, aluminum, another suitable material, or any combination of the foregoing.

Figure 16:
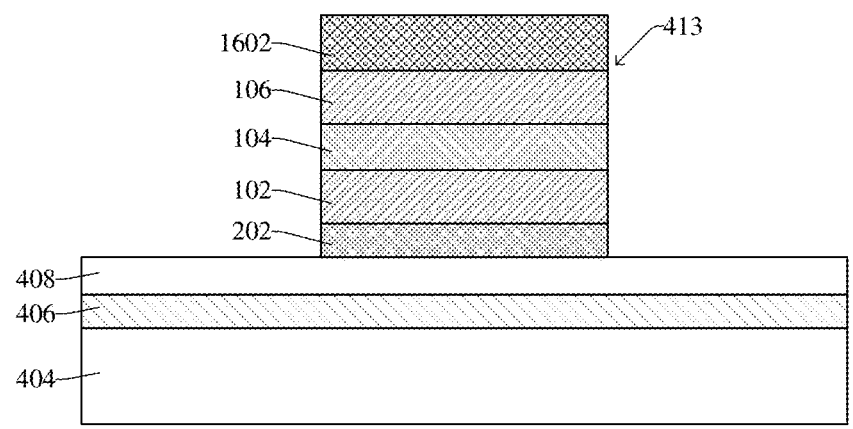

As shown in cross-sectional view 1600 of FIG. 16, a patterning process is performed on the multi-layer stack (e.g., 1402 of FIG. 14 or 1402 of FIG. 15) to form a gate structure 413. In various embodiments, the patterning process comprises: forming a masking layer 1602 over the upper metal layer 106; performing an etching process (e.g., a wet etching process and/or a dry etching process) on one or more layers of the multi-layer stack (e.g., 1402 of FIG. 14 or 1402 of FIG. 15) according to the masking layer 1602, thereby defining the gate structure 413; an performing a removal process (not shown) to remove the masking layer 1602 from over the upper metal layer 106.

In various embodiments in which the multi-layer stack (1402 of FIG. 14) comprises the lower metal layer 102, the etching process is performed on the insulating layer 202, the lower metal layer 102, the ferroelectric layer 104, and the upper metal layer 106 to define the gate structure 413. In yet another embodiment in which the multi-layer stack (1402 of FIG. 15) comprises the seed layer (502 of FIG. 15), the etching process is performed on the insulating layer 202, the seed layer (502 of FIG. 15), the ferroelectric layer 104, and the upper metal layer 106 to define the gate structure 413.

In various embodiments, an annealing process is performed after forming the gate structure 413. In various embodiments, the annealing process includes exposing the lower metal layer 102, the ferroelectric layer 104, and the upper metal layer 106 to high temperatures (e.g., heating the aforementioned layers in an environment of about 300 to 700 degrees Celsius) for a duration of about 20 seconds, within a range of about 10 to 30 seconds, within a range of about 1 to 18,000 seconds, or another suitable value. In various embodiments, the annealing process includes performing a rapid thermal anneal (RTA) process (e.g., exposing layers to heat within a range of about 300 to 700 degrees Celsius for a duration of about 20 seconds, within a range of about 10 to 20 seconds, or another suitable value), a furnace anneal process (e.g., exposing layers to heat within a range of about 300 to 700 degrees Celsius for a duration of about 30 to 18,000 seconds, or another suitable value), or another suitable annealing process. In yet further embodiments, after the annealing process a fast cooling process is performed on the lower metal layer 102, the ferroelectric layer 104, and the upper metal layer 106, where the fast cooling process includes reducing a temperature of an environment of the aforementioned layers to about 150 to 0 degrees Celsius within about 20 seconds or another suitable time. For example, the fast cooling process comprises reducing an ambient temperature in which the lower metal layer 102, the ferroelectric layer 104, and the upper metal layer 106 are disposed in from a final temperature (e.g., about 300 to 700 degrees Celsius) of the annealing process to a low temperature (e.g., about 150 to 0 degrees Celsius) within about 20 seconds or less. Due to the low CTE of the lower and upper metal layers 102, 106, the thicknesses of the lower and upper metal layers 102, 106 are mitigated from being reduced during the annealing process and the fast cooling process. This facilitates the lower and upper metal layers 102, 106 maintaining their relatively large thicknesses, thereby maintaining the increased tensile stress on the ferroelectric layer 104. In yet further embodiments, the tensile stress applied on the ferroelectric layer 104 by adjacent layers (e.g., the lower and upper metal layers 102, 106) is within a range of about 20 to 30 gigapascal (GPa), or another suitable value.

Figure 17:
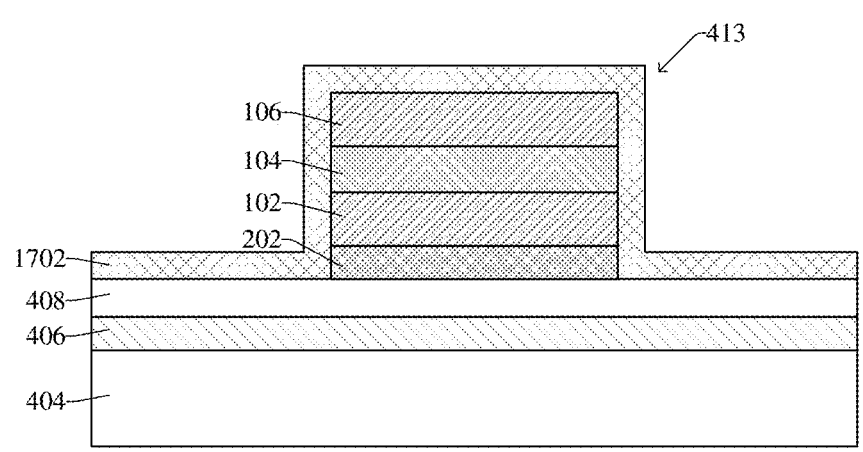

As shown in cross-sectional view 1700 of FIG. 17, a sidewall spacer layer 1702 is formed on a top surface and opposing sidewalls of the gate structure 413. In various embodiments, the sidewall spacer layer 1702 is formed by depositing the sidewalls spacer layer 1702 over the substrate 404 by an ALD process, a CVD process, a PVD process, or another suitable deposition or growth process. In some embodiments, the sidewall spacer layer 1702 may be or comprise silicon dioxide, silicon nitride, silicon oxynitride, silicon carbide, another suitable dielectric material, or any combination of the foregoing.

Figure 18:
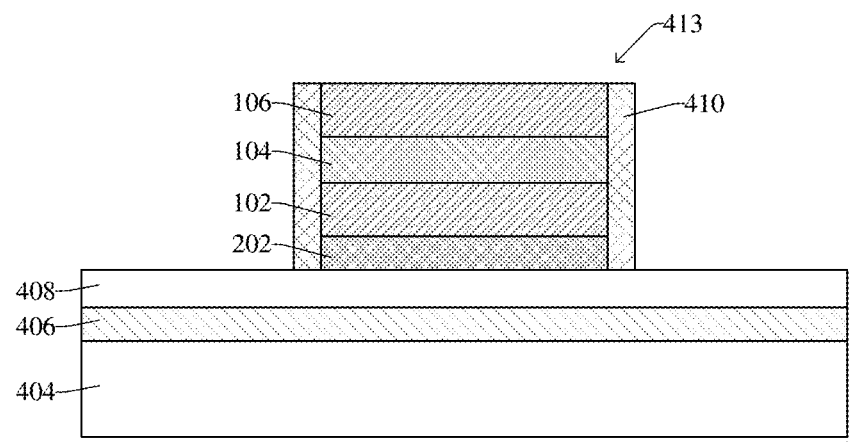

As shown in cross-sectional view 1800 of FIG. 18, an etching process is performed on the sidewall spacer layer (1702 of FIG. 17) to form a sidewall spacer structure 410 along sidewalls of the gate structure 413. In various embodiments, the etching process removes the sidewall spacer layer (1702 of FIG. 17) from a top surface of the gate structure 413 and from at least a portion of a top surface of the semiconductor layer 408. In some embodiments, the etching process includes performing a wet etch and/or a dry etch.

Figure 19:
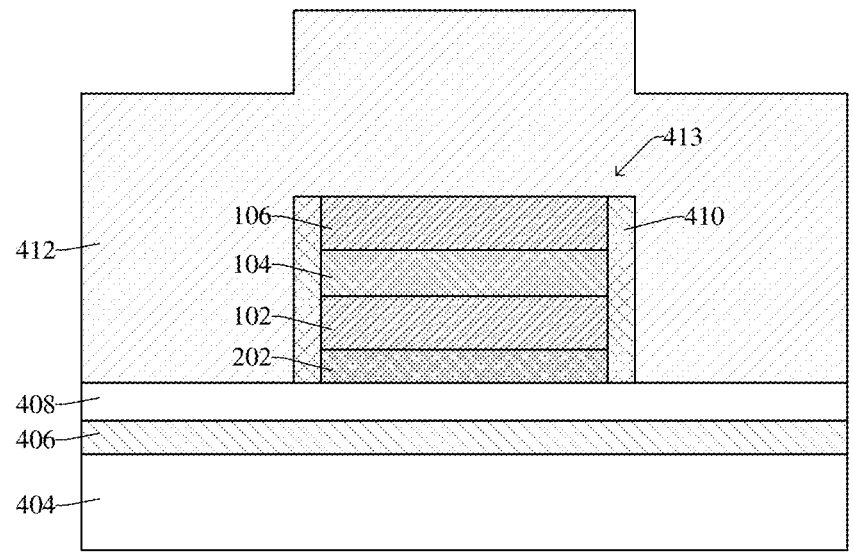

As shown in cross-sectional view 1900 of FIG. 19, a first dielectric layer 412 is formed over the semiconductor layer 408 and the gate structure 413. In various embodiments, the first dielectric layer 412 may be formed by one or more deposition process(es) such as an ALD process, a PVD process, a CVD process, or another suitable deposition process. In some embodiments, the first dielectric layer 412 may be or comprise an oxide such as silicon dioxide, a low-k dielectric material, another suitable dielectric material, or any combination of the foregoing.

Figure 20:
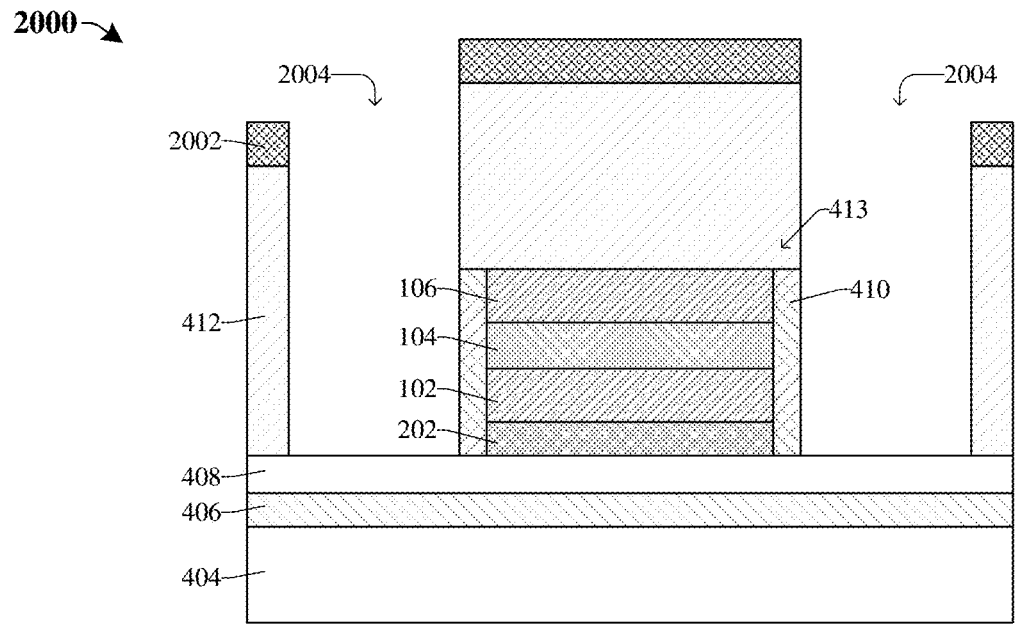

As shown in cross-sectional view 2000 of FIG. 20, a patterning process is performed on the first dielectric layer 412 to form a plurality of openings 2004 over the semiconductor layer 408. In various embodiments, the patterning process comprises: forming a masking layer 2002 over the first dielectric layer 412; performing an etching process (e.g., a wet etching process and/or a dry etching process) on the first dielectric layer 412 according to the masking layer 2002, thereby defining the openings 2004; and performing a removal process (not shown) to remove the masking layer 2002 from over the first dielectric layer 412.

Figure 21:
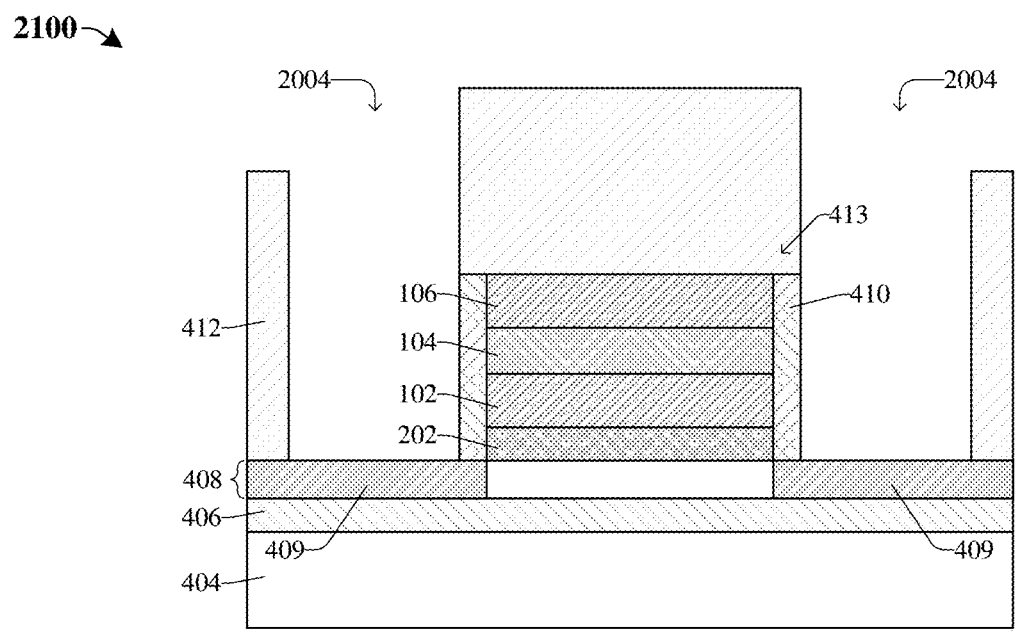

As shown in cross-sectional view 2100 of FIG. 21, a pair of source/drain regions 409 are formed in the semiconductor layer 408. In various embodiments, a process for forming the pair of source/drain regions 409 comprises performing a selective ion implantation process, where the selective ion implantation process includes implanting dopants within the semiconductor layer 408 in regions below the openings 2004. In some embodiments, the semiconductor layer 408 comprises a first doping type (e.g., p-type) and the selective ion implantation process is performed such that the pair of source/drain regions 409 has a second doping type (e.g., n-type) opposite the first doping type. In yet further embodiments, a channel region is disposed within the semiconductor layer 408 and laterally extends between the pair of source/drain regions 409. In some embodiments, the source/drain regions 409 are formed by exposing the semiconductor layer 408 to one or gases such as argon, hydrogen ($H_2$), nitrogen ($N_2$), another suitable gas, or any combination of the foregoing. In yet further embodiments, forming the source/drain regions 409 may include performing a plasma treatment process (e.g., an argon plasma treatment process) to dope the semiconductor layer 408 with one or more dopants.

Figure 22:
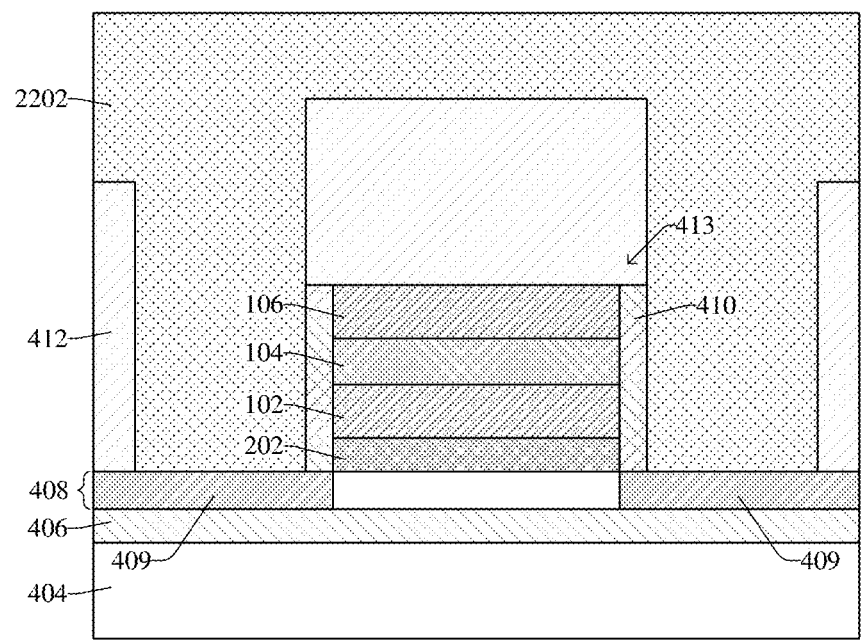

As shown in cross-sectional view 2200 of FIG. 22, a metal structure 2202 is deposited over the semiconductor layer 408 and the gate structure 413. In various embodiments, the metal structure 2202 may be deposited by a CVD process, a PVD process, an ALD process, or another suitable deposition or growth process. In some embodiments, the metal structure 2202 may be or comprise aluminum, copper, titanium, tantalum, tungsten, ruthenium, another conductive material, or any combination of the foregoing.

Figure 23:
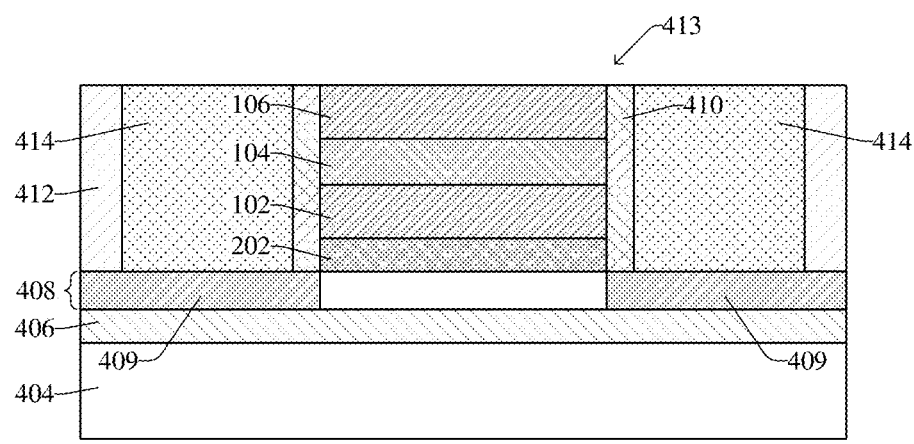

As shown in cross-sectional view 2300 of FIG. 23, a planarization process (e.g., a CMP process) is performed on the metal structure 2202 and the first dielectric layer 412 to form source/drain contacts 414. In various embodiments, the planarization process is performed such that upper surfaces of the first dielectric layer 412, the source/drain contacts 414, the sidewall spacer structure 410, and the gate structure 413 are co-planar.

Figure 24:
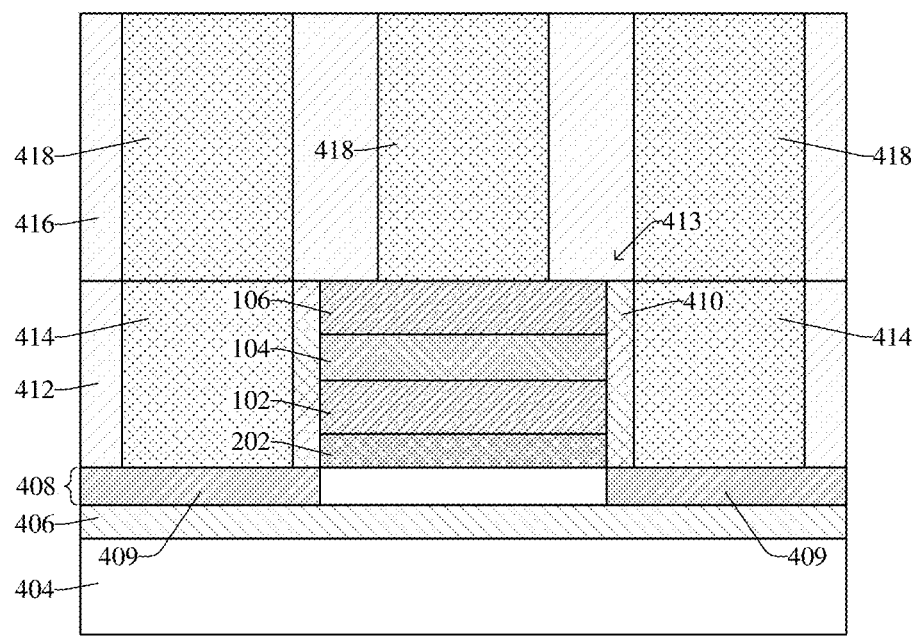

As shown in cross-sectional view 2400 of FIG. 24, a second dielectric layer 416 and a plurality of conductive structures 418 are formed over the first dielectric layer 412, the source/drain contacts 414, and the gate structure 413. In various embodiments, the second dielectric layer 416 may be formed by one or more deposition process(es) such as a CVD process, a PVD process, an ALD process, or another suitable deposition process. In some embodiments, a process for forming the plurality of conductive structures 418 comprises: patterning the second dielectric layer 416 to form openings (not shown) that overlie gate structure 413 and the source/drain contacts 414; depositing a conductive material (e.g., aluminum, copper, titanium, tantalum, ruthenium, etc.) over the second dielectric layer 416 and within the openings; and performing a planarization process (e.g., a CMP process) on the conductive material. In further embodiments, the plurality of conductive structures 418 may be configured as conductive contacts, conductive vias, conductive wires, or the like.

Figure 25:
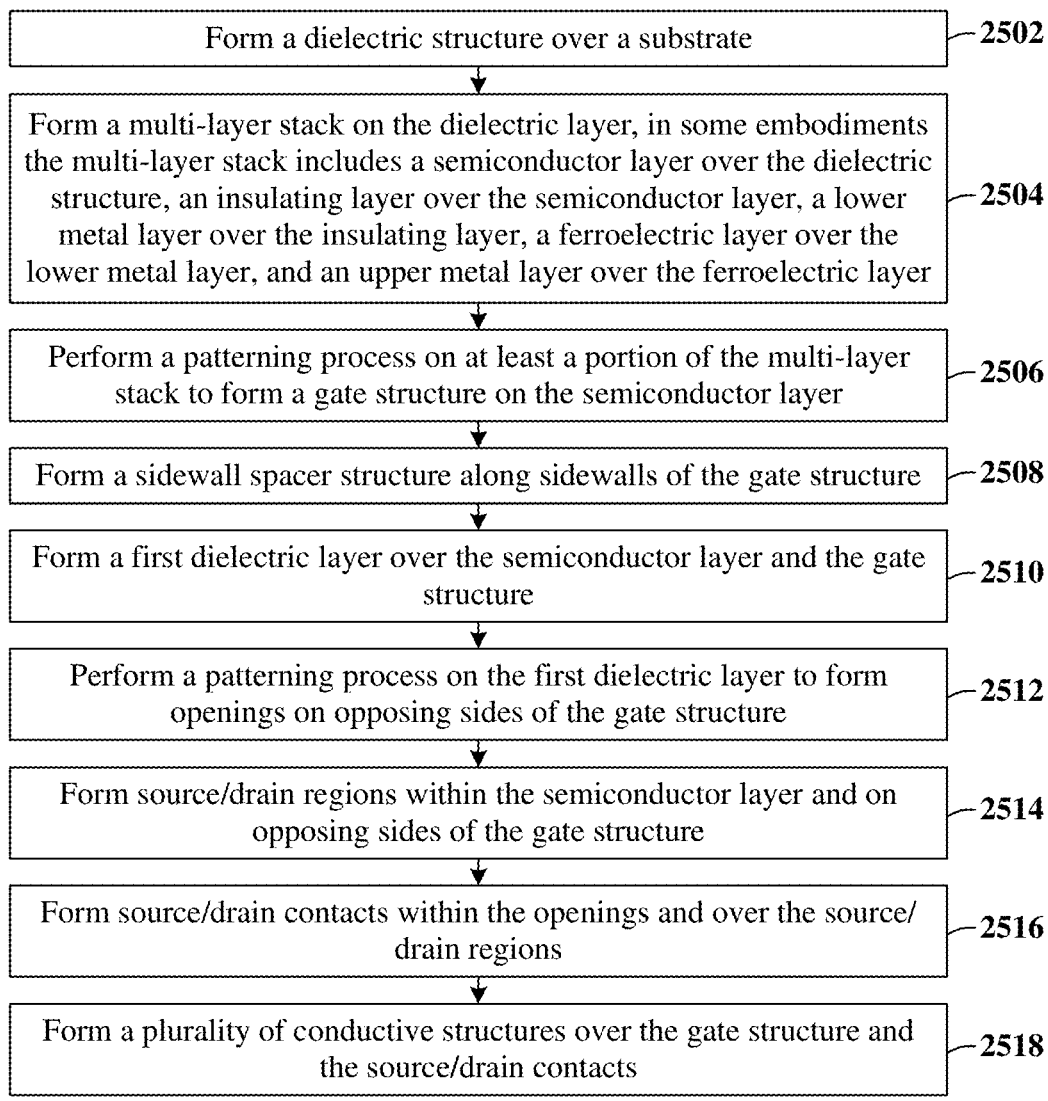
FIG. 25 illustrates a flow diagram of some embodiments of a method for forming an integrated chip comprising a ferroelectric layer disposed over a semiconductor layer and an upper metal layer disposed along the ferroelectric layer.

FIG. 25 illustrates a flow diagram 2500 of some embodiments of a method for forming an integrated chip with a ferroelectric memory device having a ferroelectric layer disposed between a lower metal layer and an upper metal layer according to aspects of the present disclosure. Although the flow diagram 2500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2502, a dielectric structure is formed over a substrate. FIG. 14 illustrates a cross-sectional view 1400 corresponding to some embodiments of act 2502.

At act 2504, a multi-layer stack is formed on the dielectric layer. In some embodiments, the multi-layer stack includes a semiconductor layer over the dielectric structure, an insulating layer over the semiconductor layer, a lower metal layer over the insulating layer, a ferroelectric layer over the lower metal layer, and an upper metal layer over the ferroelectric layer. FIG. 14 illustrates a cross-sectional view 1400 corresponding to some embodiments of act 2504. FIG. 15 illustrates a cross-sectional view 1500 corresponding to some alternative embodiments of act 2504.

At act 2506, a patterning process is performed on at least a portion of the multi-layer stack to form a gate structure on the semiconductor layer. FIG. 16 illustrates a cross-sectional view 1600 corresponding to some embodiments of act 2506.

At act 2508, a sidewall spacer structure is formed along sidewalls of the gate structure. FIGS. 17 and 18 illustrate cross-sectional views 1700 and 1800 corresponding to some embodiments of act 2508.

At act 2510, a first dielectric layer is formed over the semiconductor layer and the gate structure. FIG. 19 illustrates a cross-sectional view 1900 corresponding to some embodiments of act 2510.

At act 2512, a patterning process is performed on the first dielectric layer to form openings on opposing sides of the gate structure. FIG. 20 illustrates a cross-sectional view 2000 corresponding to some embodiments of act 2512.

At act 2514, source/drain regions are formed within the semiconductor layer on opposing sides of the gate structure. FIG. 21 illustrates a cross-sectional view 2100 corresponding to some embodiments of act 2514.

At act 2516, source/drain contacts are formed within the openings and over the source/drain regions. FIGS. 22 and 23 illustrate cross-sectional views 2200 and 2300 corresponding to some embodiments of act 2516.

At act 2518, a plurality of conductive structures is formed over the gate structure and the source/drain contacts. FIG. 24 illustrates a cross-sectional view 2400 corresponding to some embodiments of act 2518.

Accordingly, in some embodiments, the present disclosure relates to an integrated chip having a ferroelectric memory device that comprises a lower metal layer disposed on a lower surface of a ferroelectric layer and an upper metal layer disposed on an upper surface of the ferroelectric layer.

In some embodiments, the present application provides an integrated chip, including: a semiconductor layer overlying a substrate; a ferroelectric layer overlying the substrate; a pair of source/drain structures disposed on the semiconductor layer; a lower metal layer disposed along a lower surface of the ferroelectric layer; and an upper metal layer disposed along an upper surface of the ferroelectric layer.

In further embodiments, the present application provides an integrated chip, including: a ferroelectric layer over a substrate, wherein the ferroelectric layer has a first side opposite a second side; a semiconductor layer disposed on the first side of the ferroelectric layer; a source/drain structure disposed on the semiconductor layer; a lower metal layer disposed between the first side of the ferroelectric layer and the semiconductor layer; and an upper metal layer disposed on the second side of the ferroelectric layer, wherein a thickness of the upper metal layer is greater than a thickness of the ferroelectric layer.

In yet further embodiments, the present application provides a method for forming an integrated chip, the method includes: depositing a lower metal layer over a substrate; depositing a ferroelectric layer on the lower metal layer; depositing an upper metal layer on the ferroelectric layer; depositing a semiconductor layer on the upper metal layer; forming a pair of source/drain structures on the semiconductor layer; and wherein a coefficient of thermal expansion (CTE) of the ferroelectric layer is greater than a CTE of the upper metal layer and a CTE of the lower metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   depositing a lower metal layer over a substrate;
   depositing a ferroelectric layer on the lower metal layer;
   depositing an upper metal layer on the ferroelectric layer;
   depositing a semiconductor layer on the upper metal layer;
   forming a pair of source/drain structures on the semiconductor layer; and
   wherein a coefficient of thermal expansion (CTE) of the ferroelectric layer is greater than a CTE of the upper metal layer and a CTE of the lower metal layer.

2. The method of claim 1, further comprising:
   performing an annealing process on the lower metal layer, the ferroelectric layer, and the upper metal layer.

3. The method of claim 2, further comprising:
   performing a fast cooling process on the lower metal layer, the ferroelectric layer, and the upper metal layer after the annealing process.

4. The method of claim 1, further comprising:
   performing a patterning process on the ferroelectric layer, the upper metal layer, and the semiconductor layer such that opposing sidewalls of the semiconductor layer are aligned with opposing sidewalls of the upper metal layer.

5. The method of claim 3, wherein the annealing process includes exposing the lower metal layer, the ferroelectric layer, and the upper metal layer to a first temperature within a range of about 300 to 700 degrees Celsius for a first duration.

6. The method of claim 5, wherein the fast cooling process includes reducing the first temperature to a second temperature within a second duration, wherein the second duration is less than the first duration.

7. The method of claim 6, wherein the second temperature is within a range of about 0 to 150 degrees Celsius, wherein the second duration is about 20 seconds or less.

8. The method of claim 1, further comprising:
   depositing a lower dielectric layer over the substrate;
   patterning the lower dielectric layer to define an opening in the lower dielectric layer, wherein the lower metal layer is deposited in the opening; and
   performing a planarization process on the lower metal layer.

9. The method of claim 1, wherein the lower metal layer and the upper metal layer comprise a same material.

10. A method for forming an integrated chip, the method comprising:
    depositing a lower metal layer over a substrate;
    depositing a ferroelectric layer on the lower metal layer;
    depositing an upper metal layer on the ferroelectric layer;
    depositing a semiconductor layer on the upper metal layer;
    performing an annealing process on the lower metal layer, the ferroelectric layer, and the upper metal layer;
    forming a pair of source/drain structures on the semiconductor layer; and
    wherein a coefficient of thermal expansion (CTE) of the ferroelectric layer is greater than a CTE of the upper metal layer and a CTE of the lower metal layer.

11. The method of claim 10, further comprising:
performing a fast cooling process on the lower metal layer, the ferroelectric layer, and the upper metal layer after the annealing process, wherein the annealing process is performed for a first duration and the fast cooling process is performed for a second duration less than the first duration.

12. The method of claim 11, wherein the annealing process includes increasing a temperature of an environment of the lower metal layer, the ferroelectric layer, and the upper metal layer to a first temperature, wherein the fast cooling process reduces the temperature of the environment to a second temperature that is at least half the first temperature.

13. The method of claim 10, wherein the upper metal layer has a [111] crystal orientation.

14. The method of claim 10, wherein the pair of source/drain structures are spaced between outer sidewalls of the lower metal layer.

15. The method of claim 10, wherein a thickness of the lower metal layer is greater than a thickness of the ferroelectric layer.

16. A method for forming an integrated chip, the method comprising:
depositing a lower metal layer over a substrate;
depositing a ferroelectric layer on the lower metal layer;
depositing an upper metal layer on the ferroelectric layer;
depositing a semiconductor layer on the upper metal layer;
performing a patterning process on the ferroelectric layer, the upper metal layer, and the semiconductor layer such that opposing sidewalls of the semiconductor layer are aligned with opposing sidewalls of the upper metal layer;
forming a pair of source/drain structures on the semiconductor layer; and
wherein a coefficient of thermal expansion (CTE) of the ferroelectric layer is greater than a CTE of the upper metal layer and a CTE of the lower metal layer.

17. The method of claim 16, wherein opposing sidewalls of the lower metal layer are aligned with the opposing sidewalls of the semiconductor layer.

18. The method of claim 16, wherein forming the pair of source/drain structures comprises:
depositing a dielectric layer over the semiconductor layer;
patterning the dielectric layer to form openings in the dielectric layer over the semiconductor layer;
depositing a conductive material on the dielectric layer and in the openings; and
performing a planarization process on the conductive material.

19. The method of claim 16, wherein thicknesses of the upper metal layer and the lower metal layer are respectively greater than 50 nanometers.

20. The method of claim 16, wherein the lower metal layer and the upper metal layer respectively comprise a same conductive material.

* * * * *